United States Patent
Chen et al.

(10) Patent No.: US 8,084,347 B2
(45) Date of Patent: Dec. 27, 2011

(54) RESIST FEATURE AND REMOVABLE SPACER PITCH DOUBLING PATTERNING METHOD FOR PILLAR STRUCTURES

(75) Inventors: Yung-Tin Chen, Santa Clara, CA (US); Steven J. Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 179 days.

(21) Appl. No.: 12/318,609

(22) Filed: Dec. 31, 2008

(65) Prior Publication Data

US 2010/0167520 A1    Jul. 1, 2010

(51) Int. Cl.
*H01L 21/44* (2006.01)
(52) U.S. Cl. ........ 438/597; 438/257; 438/262; 438/587; 438/637; 438/642; 257/E21.038
(58) Field of Classification Search .......................... None
See application file for complete search history.

(56) References Cited

U.S. PATENT DOCUMENTS

| | | | |
|---|---|---|---|
| 5,141,817 A * | 8/1992 | Babich et al. ................. 428/447 |
| 5,198,386 A | 3/1993 | Gonzalez |
| 5,266,512 A | 11/1993 | Kirsch |
| 5,310,693 A * | 5/1994 | Hsue ............................. 438/262 |
| 5,429,988 A | 7/1995 | Huang et al. |
| 5,510,286 A * | 4/1996 | Kim ............................... 438/637 |
| 5,766,998 A | 6/1998 | Tseng |
| 5,915,167 A | 6/1999 | Leedy |
| 5,916,821 A | 6/1999 | Kerber |
| 5,977,638 A | 11/1999 | Rodgers et al. |
| 6,055,180 A | 4/2000 | Gudesen et al. |
| 6,239,008 B1 * | 5/2001 | Yu et al. ........................ 438/587 |
| 6,362,057 B1 | 3/2002 | Taylor |
| 6,420,231 B1 | 7/2002 | Harari et al. |
| 6,429,123 B1 * | 8/2002 | Tseng ........................... 438/642 |
| 6,436,816 B1 | 8/2002 | Lee et al. |
| 6,706,571 B1 | 3/2004 | Yu |
| 6,853,049 B2 | 2/2005 | Herner |
| 6,893,972 B2 | 5/2005 | Rottstegge |
| 6,946,719 B2 | 9/2005 | Petti et al. |
| 6,952,030 B2 | 10/2005 | Herner et al. |
| 7,081,377 B2 | 7/2006 | Cleeves |

(Continued)

FOREIGN PATENT DOCUMENTS

WO    WO 2004/001799 A    12/2003

(Continued)

OTHER PUBLICATIONS

U.S. Appl. No. 09/560,626, filed Apr. 28, 2000, Knall.

(Continued)

*Primary Examiner* — N Drew Richards
*Assistant Examiner* — Kyoung Lee
(74) *Attorney, Agent, or Firm* — Dugan & Dugan, PC

(57) ABSTRACT

A method of making a semiconductor device includes forming at least one layer over a substrate, forming at least two spaced apart features of imagable material over the at least one layer, forming sidewall spacers on the at least two features and filling a space between a first sidewall spacer on a first feature and a second sidewall spacer on a second feature with a filler feature. The method also includes selectively removing the sidewall spacers to leave the first feature, the filler feature and the second feature spaced apart from each other, and etching the at least one layer using the first feature, the filler feature and the second feature as a mask.

24 Claims, 6 Drawing Sheets

U.S. PATENT DOCUMENTS

| | | |
|---|---|---|
| 7,176,064 B2 | 2/2007 | Herner |
| 7,211,866 B2 | 5/2007 | Yuan et al |
| 7,786,015 B2 | 8/2010 | Chen |
| 2002/0151180 A1* | 10/2002 | DeBoer et al. ............ 438/703 |
| 2004/0245557 A1 | 12/2004 | Seo et al. |
| 2005/0052915 A1 | 3/2005 | Herner et al. |
| 2005/0085072 A1 | 4/2005 | Kim et al. |
| 2005/0226067 A1 | 10/2005 | Herner et al. |
| 2006/0250836 A1 | 11/2006 | Herner et al. |
| 2006/0250837 A1 | 11/2006 | Herner et al. |
| 2006/0273298 A1 | 12/2006 | Petti |
| 2007/0049035 A1 | 3/2007 | Tran |
| 2007/0049040 A1 | 3/2007 | Bai et al. |
| 2007/0072360 A1 | 3/2007 | Kumar et al. |
| 2007/0114509 A1 | 5/2007 | Herner |
| 2007/0164309 A1 | 7/2007 | Kumar et al. |
| 2007/0190762 A1 | 8/2007 | Van Haren |
| 2007/0215960 A1 | 9/2007 | Zhu et al. |
| 2008/0013364 A1 | 1/2008 | Kumar et al. |
| 2008/0076070 A1 | 3/2008 | Koh |
| 2008/0090419 A1 | 4/2008 | Koh |
| 2008/0206681 A1 | 8/2008 | Nolscher |
| 2008/0318169 A1 | 12/2008 | Taniguchi |
| 2009/0155935 A1 | 6/2009 | Petti |
| 2009/0227108 A1 | 9/2009 | Shiu et al. |
| 2009/0268508 A1 | 10/2009 | Chen |
| 2010/0105210 A1 | 4/2010 | Chen et al. |
| 2010/0193916 A1 | 8/2010 | Xu et al. |

FOREIGN PATENT DOCUMENTS

| | | |
|---|---|---|
| WO | WO 2008/150430 A | 12/2008 |
| WO | WO 2009/088587 A | 7/2009 |
| WO | WO 2010/062515 A1 | 6/2010 |

OTHER PUBLICATIONS

U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/000,758, filed Dec. 17, 2007, Petti et al.
U.S. Appl. No. 12/007,780, filed Jan. 15, 2008, Herner et al.
U.S. Appl. No. 12/007,781, filed Jan. 15 2008, Dunton et al.
U.S. Appl. No. 12/216,107, filed Jun. 30, 2008, Chan.
U.S. Appl. No. 12/149,151, filed Apr. 28, 2008, Chen et al.
U.S. Appl. No. 12/222,293, filed Aug. 6, 2008, Chan.
U.S. Appl. No. 12/289,396, filed Oct. 27, 2008, Chen et al.
Kim, Ryoung H. et al., "Double Exposure Using 193 nm Negative Tone Photoresist", Optical Microlithography XX, Proc of SPIE, vol. 6520, 65202M, 2007, 8 pgs.
Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.
Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.
U.S. Appl. No. 12/318,590, filed Dec. 31, 2008, Yung-Tin Chen et al.
International Search Report and Written Opinion of International Application No. PCT/US2009/069711 mailed Jul. 27, 2010.
Office Action of U.S. Appl. No. 12/754,602 mailed Oct. 28, 2010.
Jan. 27, 2011 Reply to Oct. 28, 2010 Office Action of U.S. Appl. No. 12/754,602.
Final Office Action of related U.S. Appl. No. 12/754,602 dated Apr. 15, 2011.
Jun. 14, 2011 Reply to Final Office Action of related U.S. Appl. No. 12/754,602 dated Apr. 15, 2011.
Notice of Allowance of related U.S. Appl. No. 12/754,602 dated Jun. 27, 2011.
Restriction Requirement of related U.S. Appl. No. 12/289,396 mailed May 11, 2011.
May 17, 2011 Response to Restriction Requirement of related U.S. Appl. No. 12/289,396 mailed May 11, 2011.
International Search Report of International Application No. PCT/US2009/061643 mailed Jun. 3, 2010.
Written Opinion of International Application No. PCT/US2009/061643 mailed Apr. 27, 2011.
International Search Report of International Application No. PCT/US2010/038125 mailed Sep. 13, 2010.
Mercha et al., "Grain Boundary Trap Passivation in Polysilicon Thin Film Transistor Investigated by Low Frequency Noise," Thin Solid Films 383 (2001), pp. 303-306.
Chen et al., "Passivation Effect of Poly-Si Thin-Film Transistors with Fluorine-Ion-Implanted Spacers," IEEE Electron Device Letters, vol. 29, No. 6, Jun. 2008, pp. 603-605.
Kim et al., "Poly-Si TFT Fabricated by Laser-Induced In-Situ Fluorine Passivation and and Laser Doping," IEEE Electron Device Letters, vol. 22, No. 8, Aug. 2001, pp. 396-398.
Aleksandrova et al., "Characteristics of Polysilicon TFTs, Hydrogenated by Ion Implantation of P-Channel," Journal of Optoelectronics & Advanced Materials, vol. 7, No. 1, Feb. 2005, pp. 313-316.
Office Action of related U.S. Appl. No. 12/289,396 mailed Aug. 1, 2011.
Aug. 11, 2011 Response to Office Action of related U.S. Appl. No. 12/289,396 mailed Aug. 1, 2011.
Terminal Disclaimer of related U.S. Appl. No. 12/289,396 filed Aug. 11, 2011.
Notice of Allowance of U.S. Appl. No. 12/754,602 mailed Oct. 11, 2011.
Notice of Allowance of related U.S. Appl. No. 12/289,396 mailed Oct. 25, 2011.

* cited by examiner

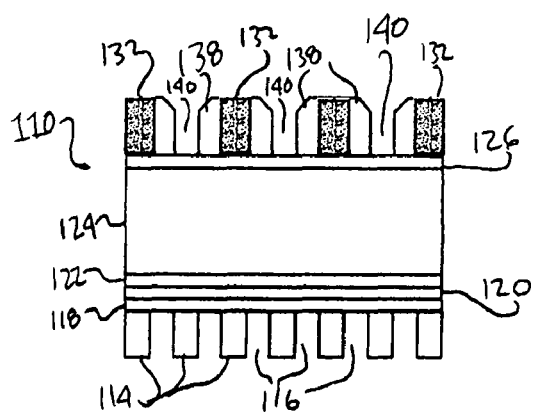 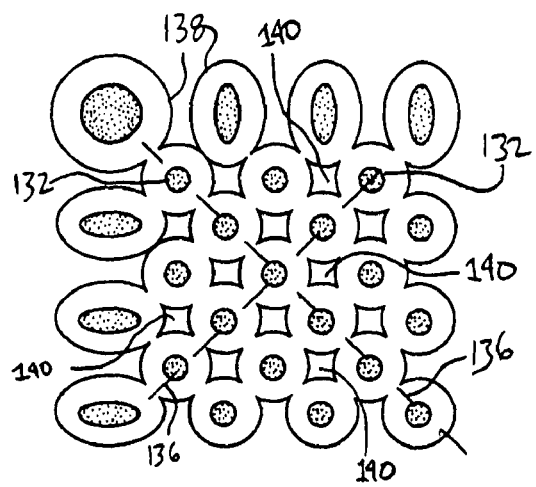
FIG - 7A  FIG - 7B
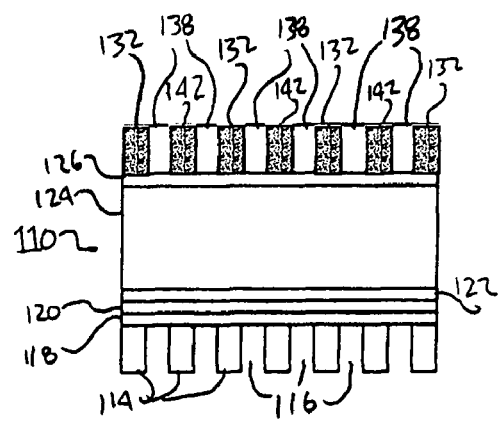 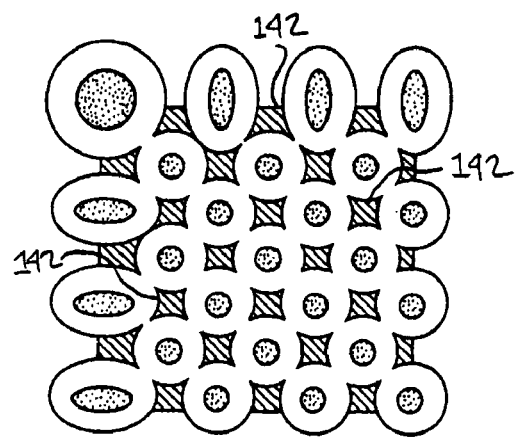
FIG - 8A  FIG - 8B

RESIST FEATURE AND REMOVABLE SPACER PITCH DOUBLING PATTERNING METHOD FOR PILLAR STRUCTURES

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is a primary motivation in the designing of such circuits.

As the dimensions for structures formed on a semiconductor wafer diminish, tools currently available to create these devices reach their limits. By way of example, currently available 193 nanometer immersion tools will fail to create structures with a pitch of less than about 80 nm. To fabricate features smaller than this with the currently available tools, one must use more complicated processes. One such process is the technique of double exposure/double patterning. Another is the use of sidewall spacers, formed on a template pattern which is then removed. The sidewall spacers are then used as mask during etching of the underlying film or films.

For simple, one-dimensional, regular line-and-space patterns, both of these techniques have the effect of dividing the photolithographically-produced pitch by two. In this way, the resolution capability of a given photolithography tool can be extended.

However, for a two-dimensional pattern of regularly-spaced pillars, the double-patterning scheme extends the pitch by a factor of the square root of 2. The sidewall spacer method, as-is, cannot be used at all since such a scheme would produce regularly spaced cylindrical annuli, rather than solid pillars.

SUMMARY

A method of making a semiconductor device includes forming at least one layer over a substrate, forming at least two spaced apart features of imagable material over the at least one layer, forming sidewall spacers on the at least two features and filling a space between a first sidewall spacer on a first feature and a second sidewall spacer on a second feature with a filler feature. The method also includes selectively removing the sidewall spacers to leave the first feature, the filler feature and the second feature spaced apart from each other, and etching the at least one layer using the first feature, the filler feature and the second feature as a mask.

A method of making a pillar shaped nonvolatile memory device array includes forming a plurality of bottom electrodes over a substrate, forming at least one device layer comprising at least one steering element layer and at least one storage element layer over the plurality of bottom electrodes, forming a hard mask stack over the at least one device layer, and forming a plurality of photoresist spaced apart features over the hard mask stack. The method also includes forming sidewall spacers on the plurality of photoresist spaced apart features, forming a plurality of photoresist filler features between the plurality of photoresist spaced apart features such that upper portions of the sidewall spacers are exposed and such that the plurality of photoresist filler features are located between the sidewall spacers, and selectively removing the sidewall spacers to leave the plurality of photoresist spaced apart features and the plurality of photoresist filler features spaced apart from each other. The method also includes etching at least a portion of the hard mask stack using the plurality of photoresist spaced apart features and the plurality of photoresist filler features as a mask, to form a plurality of hard mask features, etching the at least one device layer using the plurality of hard mask features as a mask, to form a plurality of pillar shaped nonvolatile memory cells each comprising a diode steering element and a resistivity switching storage element, and forming a plurality of upper electrodes contacting the plurality of nonvolatile memory cells.

BRIEF DESCRIPTION OF THE DRAWINGS

FIGS. 6 through 10 are cross-sectional side views (Figures with subpart a) and top views (Figures with subpart b) of process steps of making a device array according to one embodiment of the invention.

DETAILED DESCRIPTION OF THE EMBODIMENTS

Figure 1:
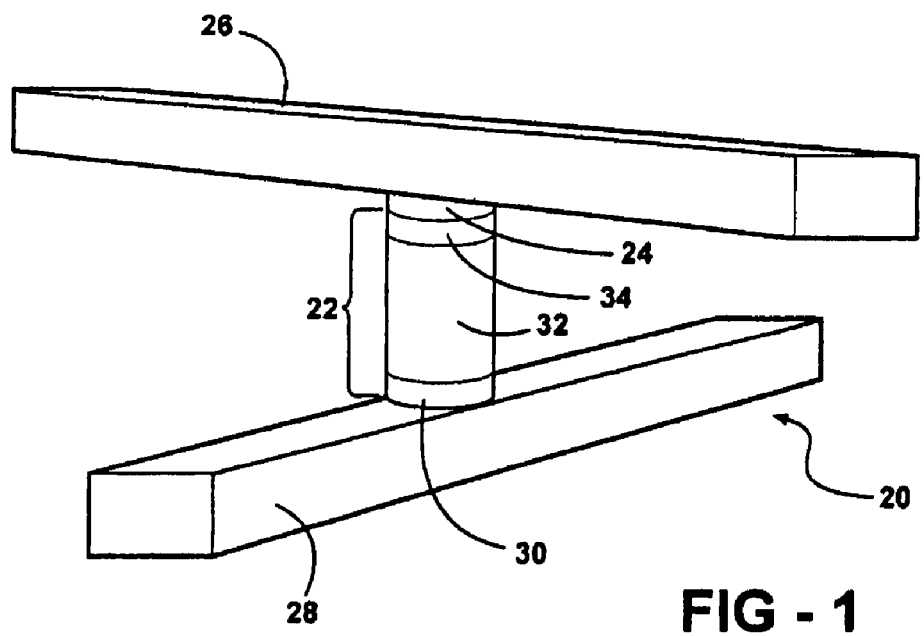
FIG. 1 is a perspective view of a nonvolatile memory cell.

The present inventors realized that instead of using sidewall spacers as mask for etching device layers, the sidewall spacers may instead be used as sacrificial spacers when forming the etching mask. Once the etching mask is formed, the sidewall spacers are removed and portions of the device layers located below the former sidewall spacer locations are removed to leave spaced apart devices, such as pillar shaped devices.

For example, one or more device layers are first formed over a substrate. Any suitable substrate may be used, such as a semiconductor wafer (including silicon or compound semiconductor wafers) or a metal, glass, ceramic or plastic substrate. The substrate may be covered by one or more insulating layers and/or one or more devices, such as driver circuits, may be formed on or in the substrate. The device layers may comprise semiconductor layers for semiconductor devices, electrically conductive layer or layers which form electrodes, and/or insulating layers for isolation of the semiconductor or conductive portions of the devices.

At least two spaced apart features are then formed over the device layers. Preferably, a plurality (i.e., more than two) features are formed to form a large device array. The features may be formed directly on or above semiconductor, conductive and/or insulating device layers. The features may have any shape as long as these features can subsequently function as an etching mask for etching the underlying device layers.

For example, as will be described in more detail below, the features may have a cylindrical shape. However, other shapes, such as rectangular or triangular shape may also be used if rectangular or triangular devices are to be formed. The features may have any desired size, and preferably have the same width as the desired width of the underlying devices. The features should have a sufficient height or thickness to act as an etching mask. The features comprise an imagable material, such as an imagable polymer material, including a photoresist material (including visible and UV imagable photoresist material), an electron beam imagable resist material or a nanoimprint lithography imagable resist material. Thus, by using an imagable material rather than a non-imagable material for the features, a separate etching step used to etch non-imagable features is omitted. Optionally, a trimming step may be conducted to reduce the size of the spaced apart features. Any suitable trimming method, for example, dry etching, may be used for trimming the spaced apart features.

Sidewall spacers are then formed on the features. Sidewall spacers may be formed by conventional sidewall spacer formation methods, such as by depositing a film over the features and then anisotropically etching the film to leave sidewall spacers on the features. The spacers may be made of a conductive, insulating or semiconductor material different from that of the upper portions of the features. The sidewall spacer material can be selected i) such that it can be selectively anisotropically etched with dry etch chemistry compared to the material of the spaced apart features; and ii) such that it can be selectively removed (such as isotropically etched) compared to the material of the spaced apart features using a different dry or wet etch chemistry. For example, when the features comprise an imagable material, such as photoresist material, the spacers may be formed from silicon oxide or silicon nitride. Other material combinations may also be used.

Subsequently, the spaces between adjacent spacers located on adjacent features are filled with so-called filler features. The filler features may be formed by forming a filler film or layer over and between the features and the sidewall spacers. Preferably, the filler film comprises a flowable material and/or is deposited by liquid phase deposition, such as spin-on coating. For example, the filler film may comprise any suitable imagable or non-imagable polymer material that has a viscosity of about 1 to about 15 centipoise to render it flowable and is deposited by liquid phase deposition. The flowable filler material fills the spaces between the spacers and exposes the upper portions of the spaced apart features and the spacers without the need to remove the upper portions of the flowable filler material. The resulting filler features have about the same height as the spaced apart features made of the imagable material. If a non-flowable material is used for the filler film, then an upper portion of the filler film is removed by etching or polishing to expose upper portions of the sidewall spacers. The filler film material may comprise the same material as the imagable feature material (i.e., photoresist, e-beam resist or nanoimprint lithography resist) of the spaced apart features or a different material from the imagable material, but which has a similar etch characteristics or etch resistance to that of the imagable material with respect to the spacer material etching medium (i.e., which resists the etching gas or liquid which will be used to etch the spacers to about the same degree as the imagable material). The filler film material should be different from the material of the sidewall spacers so that the sidewall spacers can be selectively etched compared to the spaced apart imagable material features and the filler features.

After the filler features are formed, the sidewall spacers are selectively removed. The step of selectively removing comprises selectively etching the material of the sidewall spacers without substantially removing the original imagable spaced apart feature or filler feature material. The removal may be performed by selective wet etching for example. The removal of the spacers leaves the spaced apart features and the filler features spaced apart from each other.

The spaced apart features and filler features then function as etching mask during the etching of the underlying hard mask and/or device layers. The hard mask and/or device layers may be etched using isotropic or anisotropic etching using the spaced apart features and the filler features as a mask. Optionally, prior to the step of etching the hard mask and/or device layers, the filler features may be trimmed to reduce their sizes and/or to round their corners. Any suitable trimming method, for example, dry etching, may be used for trimming the filler features. In some embodiments, the spaced apart features may be trimmed during the step of trimming the filler features. The spaced apart features and/or filler features may be removed after etching the hard mask or device layers.

Any suitable devices may be formed. The devices may have a substantially cylindrical and/or substantially rectangular pillar shape, depending on the shape of the features and the filler features, as will be described in more detail below. Non-pillar shaped devices may also be formed. The devices may comprise diodes, transistors, resistors, antifuse dielectrics, fuses, resistivity-switching materials, capacitors, etc. Logic, volatile memory or nonvolatile memory devices or arrays may be formed.

In a preferred non-limiting embodiment, a plurality of pillar shaped devices which comprise a plurality of diode containing nonvolatile memory cells are formed. Referring to FIG. 1, U.S. Pat. No. 6,952,030, issued to Herner et al. and entitled "High-Density Three-Dimensional Memory Cell," hereinafter the "'030 patent" and hereby incorporated by reference, discloses an exemplary nonvolatile memory cell which can be formed by the method of the embodiments of the present invention.

The memory cell 20 includes a vertically oriented, cylindrical pillar shaped junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material.

The diode 22 and an optional antifuse dielectric 24 are interposed between top 26 and bottom 28 conductors or electrodes. The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the antifuse dielectric 24 are arranged in series between the bottom conductor 28 and the top conductor 26, which may be formed of a metal, such as tungsten and/or TiN. The antifuse dielectric 24 may be located above or below the diode 22.

The memory cell may comprise a one-time programmable (OTP) or re-writable nonvolatile memory cell. For example, each diode 22 may act as a steering element of a memory cell and another material or layer 24 which acts as a resistivity switching material (i.e., which stores the data) is provided in series with the diode between the conductors. Specifically, instead of the antifuse dielectric, the resistivity switching material 24 may comprise a fuse, polysilicon memory effect material, metal oxide (such as nickel oxide, perovskite materials, etc,), carbon nanotubes, phase change materials, switchable complex metal oxides, conductive bridge elements, or switchable polymers. The resistivity of the resistivity switching material 24 may be increased or decreased in response to a forward and/or reverse bias provided between the electrodes or conductors.

Briefly, the cell 20 operates as follows. In the initial state, very little current flows through the junction diode 22 when a read voltage is applied between the top conductor 26 and the bottom conductor 28 because the antifuse dielectric 24 impedes current flow. The application of a programming voltage between the top conductor 26 and bottom conductor 28 causes dielectric breakdown of the antifuse material, permanently forming a conductive path through the antifuse 24. If the diode semiconductor material is initially formed in a high resistivity state, then the semiconductor material of diode 22 may be altered as well, changing it to a lower-resistivity state. After programming, a higher read current flows between the top conductor 26 and the bottom conductor 28 upon application of a read voltage. In this way, a programmed cell can be distinguished from an unprogrammed cell.

In alternative embodiments, the antifuse dielectric 24 may be omitted. Instead, the polycrystalline semiconductor material of diode 22 is formed in a relatively high-resistivity state, which also tends to impede current flow, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage lowers the resistivity state of the diode. Thus, the diode acts as a resistivity switching material in this embodiment.

Figure 2:
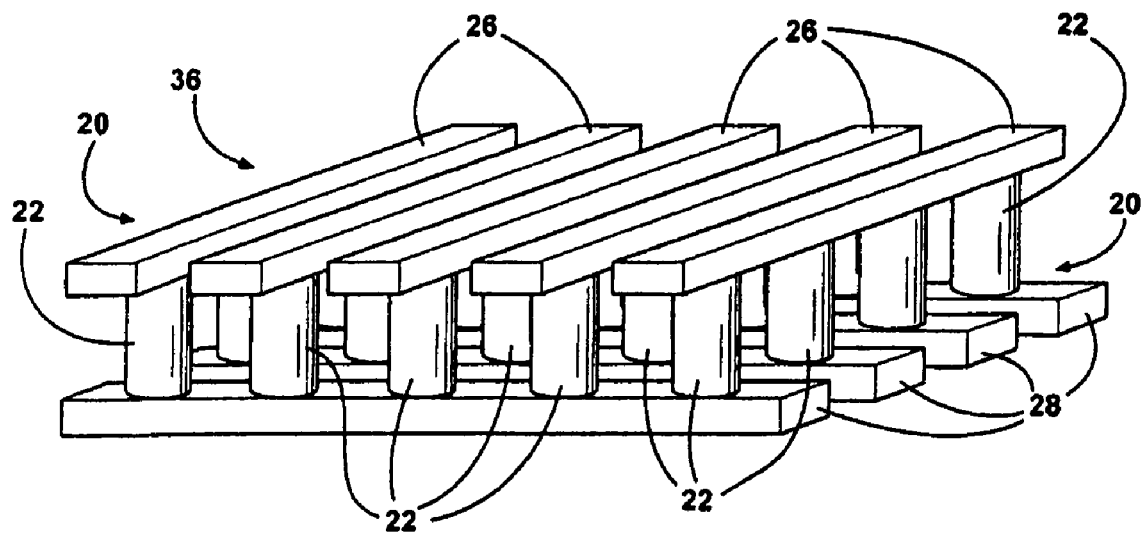
FIG. 2 is a perspective view of an array of memory cells of FIG. 1.

Referring to FIG. 2, a portion of a first memory level 36 of memory cells 20 similar to the cell 20 of FIG. 1 is shown. Two, three, four, or more such memory levels, such as eight levels may be formed, stacked one atop the other, to form a monolithic three dimensional memory array, preferably formed above a substrate such as a monocrystalline silicon wafer, and described in the '030 patent and the '549 and '530 applications. The diode pillars 22 preferably have a pitch of less than 100 nm, such as pitch of 78 nm or less and a diameter of 100 nm or less, such as 50 nm or less, such as 32 nm for example.

The bottom electrodes or conductors 28 can be formed either by subtractive or by Damascene methods. In a subtractive method, a conductive layer or film is patterned into spaced apart electrodes and the gaps between the electrodes are then filled with an insulating material. In a Damascene method, grooves are formed in an insulating material, a conductive layer or film is formed in the grooves and over the insulating layer, and then the conductive layer or film is planarized to leave spaced apart electrodes in the grooves.

Figure 3A:
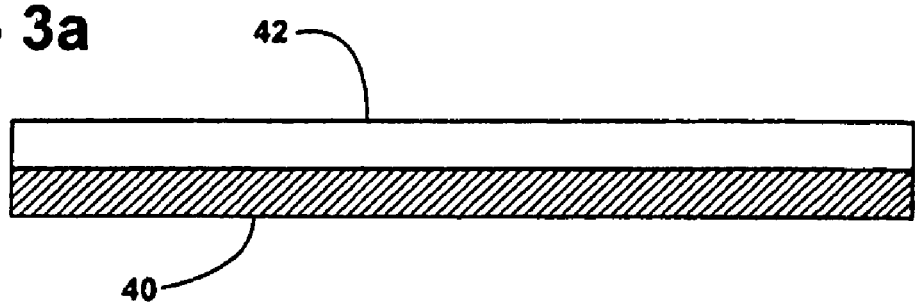
FIGS. 3a through 3d are cross-sectional side views illustrating steps in the process of forming conductive rails by a subtractive method.
Figure 3B:
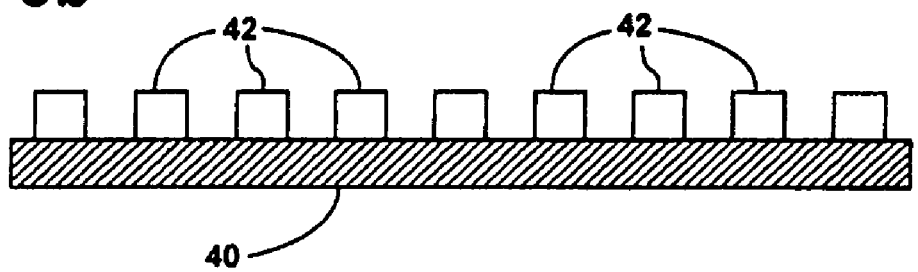
Figure 3C:
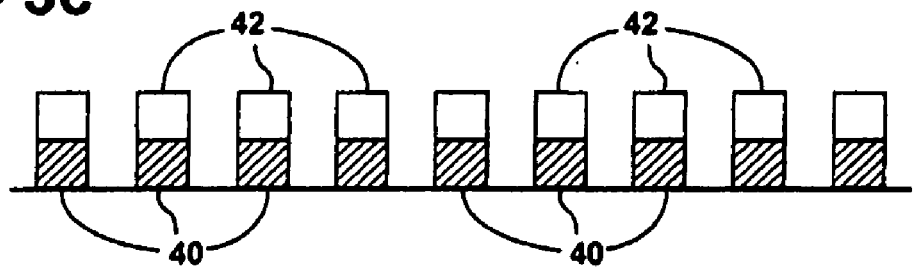
Figure 3D:
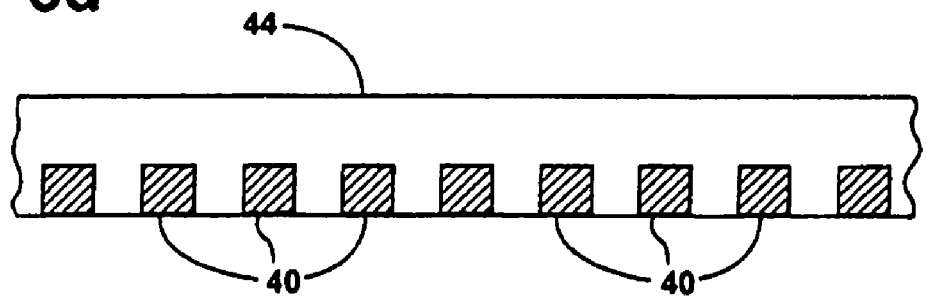

FIGS. 3a-3d illustrate the subtractive method of forming rail-shaped electrodes or conductors 28. As shown in FIG. 3a, one or more conductive layers 40, such as a W and/or a TiN layers are deposited over a substrate, and a layer of photoresist 42 is spun onto it. As shown in FIG. 3b, the layer of photoresist 42 is then photolithographically patterned into the desired form. As shown in FIG. 3c, an etch step removes portions of the conductive layer(s) 40 where they are not protected by etched photoresist layer 42. As shown in FIG. 3d, after the etch, the photoresist layer 42 is stripped, leaving conductor or electrode rails 40 behind. The gaps between the rails 40 are filled with an insulating material 44, such as silicon oxide, silicon nitride or other insulating materials. If desired, any overfill of the insulating material 44 can be removed, for example by chemical-mechanical polishing (CMP), to expose the upper surface of the rails 40 in the planarized surface of the insulating layer 44.

Figure 4A:
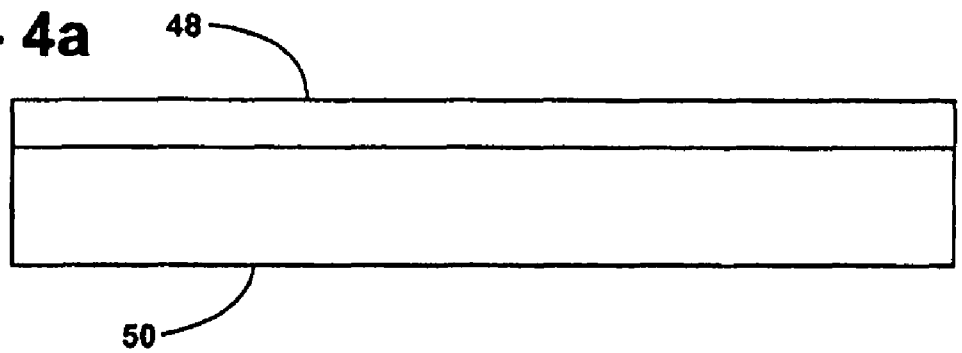
FIGS. 4a through 4d are cross-sectional side views illustrating steps in the process of forming conductive rails by a Damascene method.
Figure 4B:
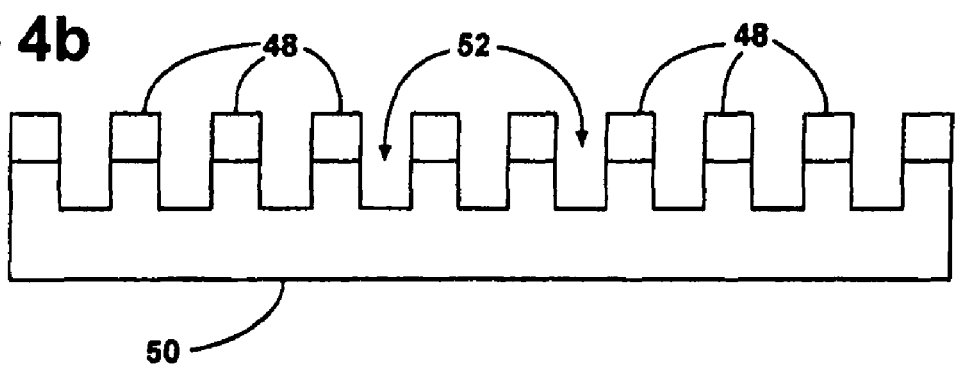
Figure 4C:
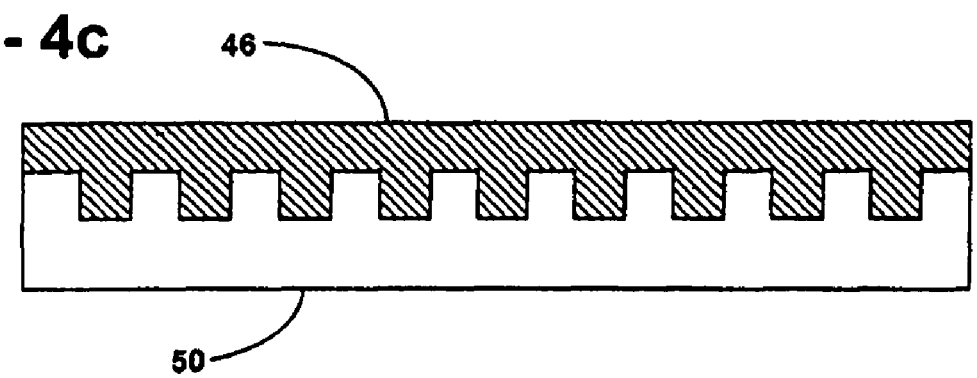
Figure 4D:
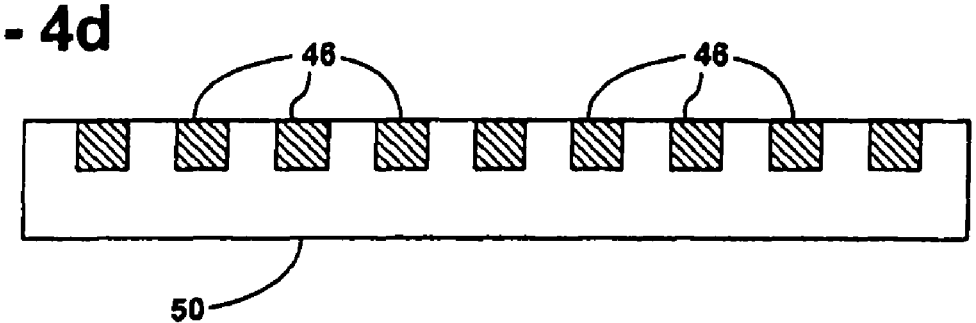

FIGS. 4a to 4d illustrate the Damascene method to form the electrode or conductor 28. First, a layer of photoresist 48 is spun onto a deposited insulating layer 50, such as a silicon oxide layer. As shown in FIG. 4b, the layer of photoresist 48 is patterned. An etch step then forms grooves or trenches 52 in the insulating layer 50. In FIG. 4c, after removal of the photoresist layer 48, one or more conductive layers 46, such as a W and/or TiN layers are deposited to fill the grooves or trenches 52. The one or more conductive layers 46 are planarized, for example by CMP or etchback, with the upper surface of the insulating layer to leave the rail shaped conductors in the grooves, as shown in FIG. 4d.

Figure 5:
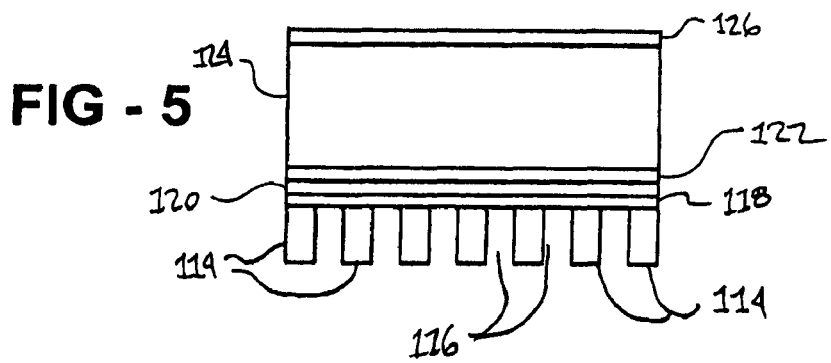
FIG. 5 is a cross-sectional side view of the device layers prior to the formation of the pillar structures.

FIG. 5 shows an initial stage of fabrication of a semiconductor device, such as a pillar shaped nonvolatile memory cell array 110, according to one embodiment of the invention. The array 110 contains a plurality of bottom electrodes 114 formed by the subtractive or Damascene methods described above with respect to FIG. 3 or 4 respectively. The electrodes 114 correspond to the rail shaped conductors 28 shown in FIGS. 1 and 2. The electrodes 114 may comprise any suitable conductive material, such as tungsten, aluminum, their alloys, etc. The electrodes 114 are separated from each other by an insulating material 116, such as silicon oxide. An optional adhesion layer 118 is formed above the electrodes 114. The adhesion layer may comprise titanium nitride or tungsten nitride. The optional antifuse dielectric layer 120 is deposited over the adhesion layer 118. The antifuse dielectric layer 120 may comprise a thin silicon oxide or other insulating layer. Alternatively, another resistivity switching material described above may be substituted from the antifuse dielectric layer. Another optional adhesion layer 122, such a TiN layer, is deposited over the antifuse dielectric layer 120. Therefore, the dielectric layer 120 is sandwiched between two adhesion layers 118, 122.

One or more semiconductor layers 124, such as silicon or germanium or their alloys are formed over the adhesion layer 122. For example, the semiconductor layers 124 may comprise a lower n-type layer, a middle intrinsic layer and an upper p-type layer. The p-type layer may be formed by ion implantation of p-type dopants into the upper part of the intrinsic layer or by deposition of a p-type doped semiconductor layer on the intrinsic layer. An optional upper hard mask stack 126, is formed over the semiconductor layers 124. The hard mask stack may comprise one or more layers selected from a Bottom Anti-Refection Coating (BARC) layer, a Dielectric Anti-Reflection Coating (DARC) layer (such as a silicon oxynitride layer), an organic hard mask layer, a conductive hard mask layer or layers, or an oxide hard mask layer. The organic hard mask layer may be an amorphous carbon advanced patterning film (APF). For example, the stack 126 may comprise a 10 to 20 nm, such as 15 nm TiN layer, a 25 to 75 nm, such as 50 nm W layer, a 100 to 300 nm, such as 200 nm APF layer, a 30 to 50 nm, such as a 40 nm SiON DARC layer, and a 15 to 40 nm, such as 25 nm BARC layer, from bottom to top.

Figure 6A:
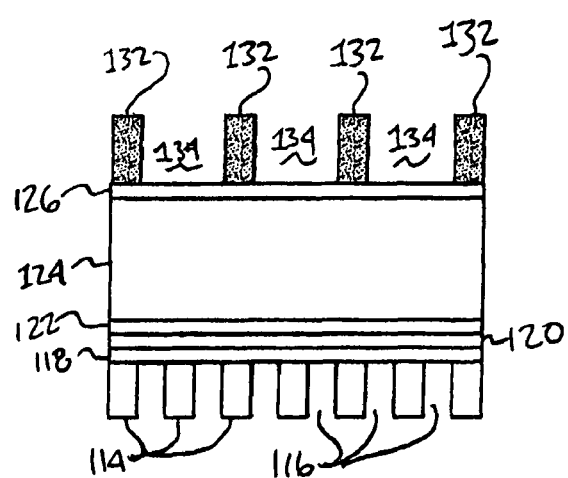
Figure 6B:
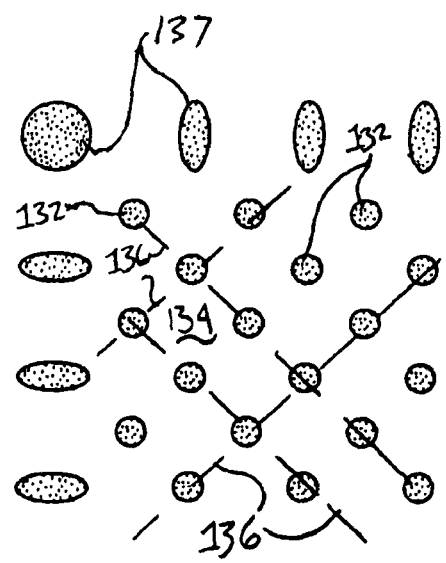

Referring to FIGS. 6a and 6b, a first step in the process of creating the pillar devices is shown. FIG. 6a represents a side cross-sectional view of the device layers and FIG. 6b represents a top view of the same after the first step. In the first step, a plurality of features 132 are formed over the hard mask stack 126 (or over the semiconductor layer 124 if stack 126 is omitted). The features are spaced apart from each other by spaces 134 (in the horizontal and vertical directions as shown in FIG. 6b). The features 132 are formed by imaging the imagable material by photo, electron beam or nanoimprint lithography, followed by patterning the imaged material into the features 132. The features 132 may be 75 to 200 nm thick, such as 120 to 150 nm thick photoresist features, such as 193 nm radiation sensitive photoresist. The features 132 may optionally be trimmed after formation to reduce their size. If a BARC layer is present on top of the hard mask stack 126, then it may be patterned together with the features 132 or using features 132 as a mask such that the BARC layer portions are located only under the features 132.

The features 132 are preferably arranged along a plurality of imaginary diagonal lines 136 in a rhombus or rotated square type pattern, as shown in FIG. 6b. Only four of the plurality of diagonal lines 136 are shown in FIG. 6b for clarity. As shown in FIG. 6b, the features 132 preferably have a substantially cylindrical shape (i.e., they have a circular or near circular (such as oval) cross section).

Alignment edge features 137 are provided adjacent to the device array boundary, as shown in FIG. 6b. The alignment edge features may have a larger size than the plurality of spaced apart features 132 and/or they may have a different shape, such as an oval cross sectional shape. The alignment edge features will be used to simplify alignment in the cut mask step that will be described below.

FIGS. 7a and 7b show the next process step. In this step, silicon oxide spacers 138 are formed on each feature 132. It should be noted that if each feature 132 is cylindrical, then it technically has only one sidewall and only one ring or annulus shaped spacer 138 is formed around the sidewall of the feature 132. However, as used herein, the term "spacers" will denote the single annular spacer 138 as well as two or more spacers 138 formed on discrete sidewalls of a polygonal feature 132. The spacers 138 are formed by depositing a silicon oxide layer or film over and between the features 132 followed by anisotropic etching of the silicon oxide layer or film.

The oxide spacers 138 fill the spaces 134 around the features 132 primarily along the plurality of diagonal lines 136, leaving discrete spaces or interstices 140 between adjacent sidewall spacers 138. Due to the annular shape of the sidewall spacers 138, the interstices have a rectangular cross sectional shape with concave sidewalls, as shown in FIG. 7b.

FIGS. 8a and 8b show the next two steps of the process. A filler film is formed between and over the features 132 and spacers 138. The filler film may comprise an imagable material, for example, a photoresist material, an e-beam resist material, a nanoimprint resist material, or a non-imagable material. The filler film is preferably deposited by a liquid phase method, such as spin-on or spray coating, to expose the upper surfaces of the spacers 138. The deposition step leaves a plurality of imagable material filler features 142 between the sidewall spacers 138. Since the filler features 142 fill the interstices 140, the filler features 142 also have a rectangular or square cross sectional shape with concave sidewalls (i.e., a substantially rectangular or square shape). At this point in the fabrication of the device array, the spaces 134 are completely filled with either oxide spacers 138 or filler features 142.

If desired, an optional cut masking and etching step is performed to remove the filler film or filler features 142 from the area outside of the device array. A photoresist layer is formed over the plurality of filler features 142 and over the plurality of spaced apart features 132. The photoresist layer is exposed such that the edges of the exposed areas intersect all of the edge features 137. Elongating or enlarging the edge features 137 thus allows for an easier alignment of this cut mask. The remaining filler film or filler features remaining in areas outside of the device array boundary that are not covered by the photoresist pattern are etched away. Alternatively, if the filler film comprises an imagable material, such as a photoresist material, the step of cut masking and etching step made be preformed by simply imaging the imagable material (such as for example the exposing the photoresist filler film to radiation) in such a way that the edges of the exposed areas intersect all of the edge features 137. If desired, the cut masking and etching step can be performed after the step of removing the spacers 138.

Figure 9A:
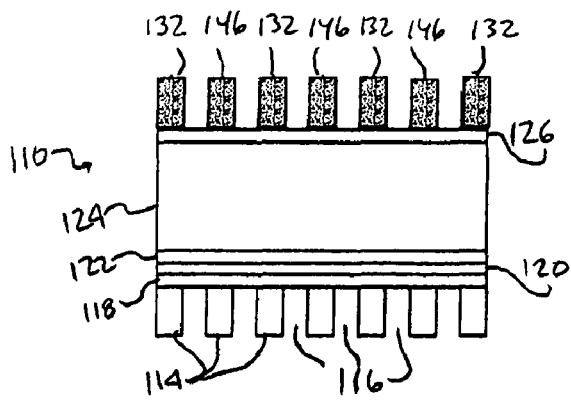
Figure 9B:
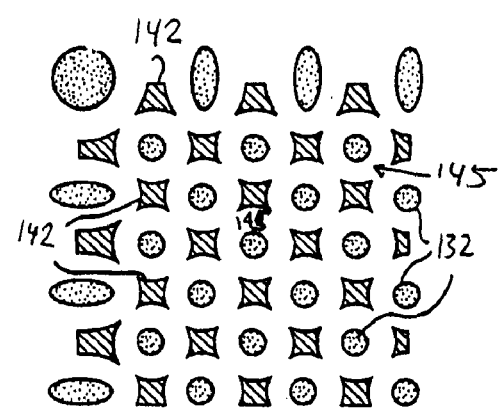

FIGS. 9a and 9b show the next step in the process. In this step, the oxide spacers 138 are selectively etched away leaving the features 132 and filler features 142 spaced apart by spaces 145. The spacers 138 may be selectively etched by any selective wet or dry etch which can selectively etch silicon oxide over the spaced apart features 132 and over the material of filler features 142. For example, an HF isotropic wet etch may be used. The pitch between the features 132 and the filler features 142 has doubled compared to the pitch between the features 132 alone due to the removal of the oxide spacers. If desired, a portion of the hard mask stack 126 may also be etched during the spacer removal. For example, if a DARC layer is present in the stack, then first portions of the DARC layer located under the spacers may also be removed during the spacer removal process to leave second portions of the DARC layer below the imagable material features 132 and the filler features 142.

Figure 10A:
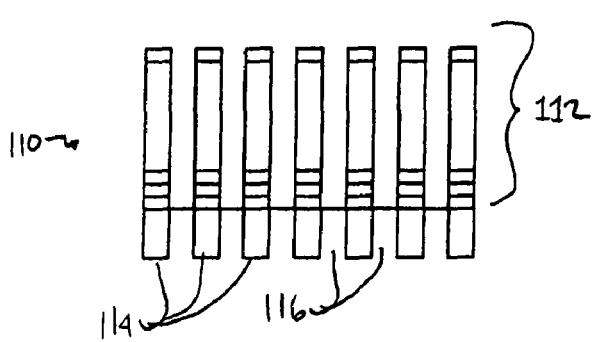
Figure 10B:
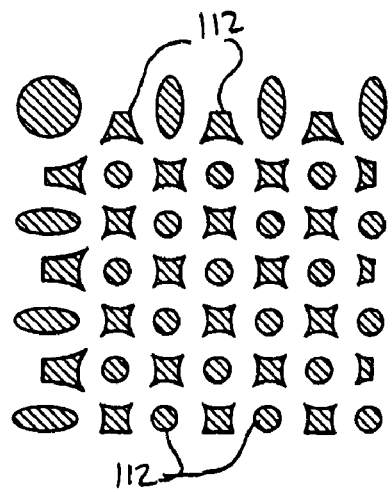

As shown in FIGS. 10a and 10b, at least one of the hard mask stack 126 and/or the device layers 118, 120, 122 and 124 are etched using the features 132 and the filler features 142 as a mask to form a plurality of pillar shaped devices 112.

For example, the features 132 and filler features 142 as well as any BARC layer material remaining under the features 132 and filler features 142 may be removed after patterning the DARC layer of the hard mask stack 126 using the features 132 and filler features 142 as a mask. The DARC layer may be patterned (i.e., etched) during the same step as the spacer 138 removal step. The patterned DARC layer may be trimmed after patterning to reduce the size of the remaining DARC layer patterns and to round the corners of the DARC layer patterns. It should be noted that the BARC and DARC layers may be etched together using the features 132 and the filler features 142 as a mask or the BARC layer may be etched prior to the step of forming the spacers 138, using the features 132 as a mask, while the DARC layer is etched using the features 132 and the filler features 142 as a mask.

The patterned DARC layer may then be used as a mask to pattern the remaining layers of the hard mask stack 126, such as the APF, tungsten and TiN layers. The DARC layer may optionally be removed during and/or after patterning the remaining hard mask stack 126 layers. The remaining patterned hard mask stack 126 layers are then used as a mask to etch the device layers 118, 120, 122 and 124 to form a plurality of pillar shaped devices 112. For example, each of the devices comprises the p-i-n diode in series with an antifuse dielectric, as described with respect to FIG. 1. The pillar shaped devices 112 have a pitch which is double that of what the pitch would have been had only the features 132 been used as mask.

The spaces between the pillar devices 112 are filled with a gap fill insulating material, such as silicon oxide, to isolate the devices 112 from each other. The gap fill insulating material may be planarized by CMP or etchback. The upper conductors or electrodes 26 may be formed over the devices 112 by the subtractive or the Damascene processes described above with respect to FIG. 3 or 4. The tungsten and TiN layers of the hard mask stack 126 may be retained in the final device as portions of the upper electrodes 26. The APF layer is preferably removed after patterning the device layers.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A method of making a semiconductor device, comprising:
    forming at least one layer over a substrate;
    forming at least two spaced apart features of imagable material over the at least one layer, wherein the at least two spaced apart features comprise a plurality of features;
    forming sidewall spacers on the plurality of features, such that the sidewall spacers on adjacent features along at least two predetermined directions contact each other to form fully enclosed interstitial spaces located between the sidewall spacers;
    filling a space between a first sidewall spacer on a first feature and a second sidewall spacer on a second feature with a filler feature;
    selectively removing the sidewall spacers to leave the first feature, the filler feature and the second feature spaced apart from each other; and
    etching the at least one layer using the first feature, the filler feature and the second feature as a mask.

2. The method of claim 1, further comprising:
    filling each space between each two adjacent features of the plurality of features with one of a plurality of filler features; and
    etching the at least one layer using the plurality of features and the plurality of filler features as a mask.

3. The method of claim 1, wherein:
    the at least two features and the filler feature comprise a first material and the sidewall spacers comprise a second material different from the first material; and
    the step of selectively removing comprises selectively etching the second material of the sidewall spacers without substantially removing the first material.

4. The method of claim 1, wherein:
    the at least two features comprise a first material, the filler feature comprises a second material and the sidewall spacers comprise a third material different from the first and the second material; and
    the step of selectively removing the sidewall spacers comprises selectively etching the third material of the sidewall spacers without substantially removing the first or the second material.

5. The method of claim 1, wherein the step of filling the space between the first sidewall spacer on the first feature and the second sidewall spacer on the second feature with the filler feature comprises depositing a flowable polymer filler material by liquid phase deposition over the first and the second features such that upper portions of the sidewall spacers are exposed.

6. The method of claim 1, wherein:
    the imagable material comprises a photoresist material, an electron beam resist material or a nanoimprint resist material;
    the filler feature comprises a flowable polymer material having a viscosity of about 1 to about 15 centipose; and
    the step of selectively removing the sidewall spacers comprises selectively etching the sidewall spacers without substantially removing the at least two spaced apart features and the filler feature.

7. The method of claim 6, wherein:
    the at least two features and the filler feature comprise a photoresist material; and
    the sidewall spacers comprise silicon oxide.

8. The method of claim 1, wherein:
    the at least two features and the filler features comprise a photoresist material; and
    the sidewall spacers comprise silicon nitride.

9. The method of claim 1, further comprising removing the at least two features and the filler feature after the step of etching the at least one layer.

10. The method of claim 1, further comprising trimming the at least two features to reduce size of the at least two features, prior to the step of forming sidewall spacers on the at least two features.

11. The method of claim 1, wherein the at least one layer comprises a hard mask stack located over at least one semiconductor device layer.

12. The method of claim 11, wherein the hard mask stack comprises a BARC layer, a DARC layer, an organic hard mask layer, and at least one conductive hard mask layer.

13. The method of claim 12, wherein the step of etching the at least one layer comprises etching at least the DARC layer.

14. The method of claim 13, further comprising trimming the DARC layer to form DARC layer portions having a substantially cylindrical shape.

15. The method of claim 13, further comprising:
removing the at least two features and the filler feature after the step of etching the DARC layer;
etching at least the organic hard mask layer using the etched DARC layer as a mask; and
etching the at least one semiconductor layer using at least one of the organic hard mask layer and the conductive hard mask layer as a mask.

16. The method of claim 15, wherein the step of etching the at least one semiconductor device layer forms a plurality of pillar shaped devices.

17. The method of claim 16, wherein the plurality of pillar shaped devices comprise a plurality of nonvolatile memory cells each comprising a diode steering element and a resistivity switching storage element.

18. A method of making a pillar shaped nonvolatile memory device array, comprising:
forming a plurality of bottom electrodes over a substrate;
forming at least one device layer comprising at least one steering element layer and at least one storage element layer over the plurality of bottom electrodes;
forming a hard mask stack over the at least one device layer;
forming a plurality of photoresist spaced apart features over the hard mask stack;
forming sidewall spacers on the plurality of photoresist spaced apart features;
forming a plurality of photoresist filler features between the plurality of photoresist spaced apart features such that upper portions of the sidewall spacers are exposed and such that the plurality of photoresist filler features are located between the sidewall spacers;
selectively removing the sidewall spacers to leave the plurality of photoresist spaced apart features and the plurality of photoresist filler features spaced apart from each other;
etching at least a portion of the hard mask stack using the plurality of photoresist spaced apart features and the plurality of photoresist filler features as a mask to form a plurality of hard mask features;
etching the at least one device layer using the plurality of hard mask features as a mask, to form a plurality of pillar shaped nonvolatile memory cells each comprising a diode steering element and a resistivity switching storage element; and
forming a plurality of upper electrodes contacting the plurality of nonvolatile memory cells.

19. A method of making a semiconductor device, comprising:
forming a layer over a substrate, wherein the layer comprises a hard mask stack located over a semiconductor device layer, wherein the hard mask stack comprises a BARC layer, a DARC layer, an organic hard mask layer, and a conductive hard mask layer;
forming a plurality of spaced apart features of imagable material over the layer;
forming sidewall spacers on the plurality of features;
filling a space between a first sidewall spacer on a first feature and a second sidewall spacer on a second feature with a filler feature;
selectively removing the sidewall spacers to leave the first feature, the filler feature and the second feature spaced apart from each other; and
etching the layer using the first feature, the filler feature and the second feature as a mask.

20. The method of claim 19, wherein etching the layer comprises etching the DARC layer.

21. The method of claim 20, further comprising trimming the DARC layer to form DARC layer portions having a substantially cylindrical shape.

22. The method of claim 20, further comprising:
removing the plurality of features and the filler feature after the step of etching the DARC layer;
etching the organic hard mask layer using the etched DARC layer as a mask; and
etching the semiconductor device layer using at least one of the organic hard mask layer and the conductive hard mask layer as a mask.

23. The method of claim 22, wherein etching the semiconductor device layer forms a plurality of pillar shaped devices.

24. The method of claim 23, wherein the plurality of pillar shaped devices comprise a plurality of nonvolatile memory cells each comprising a diode steering element and a resistivity switching storage element.

* * * * *